(12) United States Patent
Lee

(10) Patent No.: US 6,184,079 B1
(45) Date of Patent: Feb. 6, 2001

(54) METHOD FOR FABRICATING A SEMICONDUCTOR DEVICE

(75) Inventor: Kyu-Pil Lee, Kyunggi-do (KR)

(73) Assignee: Samsung Electronics Co., Ltd. (KR)

( * ) Notice: Under 35 U.S.C. 154(b), the term of this patent shall be extended for 0 days.

(21) Appl. No.: 09/183,441

(22) Filed: Oct. 30, 1998

(30) Foreign Application Priority Data

Oct. 31, 1997 (KR) ................................. 97-57485

(51) Int. Cl.[7] ................. H01L 21/8242; H01L 21/8234; H01L 21/4763

(52) U.S. Cl. ..................... 438/253; 438/238; 438/622; 438/256; 438/964

(58) Field of Search ..................... 438/238, 199, 438/200, 201, 253, 582, 622, 656, 657, 675, 254, 256, 533, 573, 926, 927

(56) References Cited

U.S. PATENT DOCUMENTS

| | | | |
|---|---|---|---|
| 5,278,091 | 1/1994 | Fazan et al. | 437/52 |
| 5,352,623 | 10/1994 | Kamiyama | 437/52 |
| 5,418,180 | 5/1995 | Brown | 437/60 |
| 5,494,841 * | 2/1996 | Dennison et al. | 438/210 |
| 5,512,502 * | 4/1996 | Ootsuka et al. | 438/305 |
| 5,597,756 | 1/1997 | Fazan et al. | 437/52 |
| 5,654,241 * | 8/1997 | Kakumu | 438/306 |
| 5,663,090 | 9/1997 | Dennison et al. | 438/398 |
| 5,721,153 | 2/1998 | Kim et al. | 437/60 |
| 5,726,085 | 3/1998 | Crenshaw et al. | 438/255 |
| 5,748,521 * | 5/1998 | Lee | 365/149 |
| 5,753,558 | 5/1998 | Akram et al. | 438/386 |
| 5,753,559 | 5/1998 | Yew et al. | 438/398 |
| 5,759,894 | 6/1998 | Tseng et al. | 438/255 |
| 5,759,895 | 6/1998 | Tseng | 438/255 |
| 5,780,336 | 7/1998 | Son | 438/251 |
| 5,804,479 * | 9/1998 | Aoki et al. | 438/253 |
| 5,804,480 | 9/1998 | Lu et al. | 438/253 |
| 5,812,360 | 9/1998 | Sandhu et al. | 361/321.4 |
| 5,830,791 * | 10/1998 | Lee et al. | 438/238 |
| 5,962,907 * | 10/1999 | Motonami | 257/499 |
| 5,998,843 * | 12/1999 | Yoshida | 257/370 |
| 6,020,228 * | 2/2000 | Asakura | 438/199 |
| 6,020,643 * | 2/2000 | Fukuzumi et al. | 257/774 |
| 6,027,962 * | 2/2000 | Igarashi et al. | 438/202 |
| 6,037,215 * | 3/2000 | Lee et al. | 438/253 |

* cited by examiner

Primary Examiner—Wael Fahmy
Assistant Examiner—Brook Kebede
(74) Attorney, Agent, or Firm—Myers Bigel Sibley & Sajovec

(57) ABSTRACT

A novel method for fabricating a semiconductor memory device wherein the interconnection wiring line in a core/peripheral region is formed before bit line in a cell array region formation, thereby preventing damaging of the interconnection wiring line caused during forming the bit line and improving the process margin in the core/peripheral region.

11 Claims, 6 Drawing Sheets

METHOD FOR FABRICATING A SEMICONDUCTOR DEVICE

FIELD OF THE INVENTION

The present invention relates to a method for fabricating a semiconductor device, more particularly to a dynamic random access memory(DRAM) having a stacked capacitor.

BACKGROUND OF THE INVENTION

In the DRAM industry, as DRAMs increase in memory cell density, there is a continuous challenge to maintain sufficiently high storage capacitance despite decreasing cell area. Additionally there is a continuing goal to further decrease cell area. Generally, the capacitance of the capacitor directly related to the surface area of the capacitor. For this reason, there is continuous challenge to increase the surface area of the capacitor, i.e., conventional two-dimensional structure to three-dimensional structure(trench or stacked capacitor). The widely adopted stacked capacitor includes for example cylindrical and fin type capacitor.

From the fabrication sequence point view, the structure of the capacitor mainly classified into COB(capacitor over bit line) structure and CUB(capacitor under bit line) structure. The significant difference between them is the time when the capacitor is formed, i.e., after forming the bit line(COB) or before forming the bit line(CUB).

The COB structure has an advantage that the capacitor can be formed without regard to the bit line process margin since the capacitor is formed after the bit line formation. Therefore, it has a relatively increased capacitance in comparison with the CUB structure. On the contrary, in the COB structure, the bit line design rule put a limit on process margin for buried contacts formation for electrical connection to storage electrode and switch transistor.

FIG. 1 is a cross-sectional view showing a conventional DRAM structure. In the method for fabricating the conventional DRAM structure shown in FIG. 1, a bit line 130 in a cell array region is made of conductive material and at the same time(i.e., at the same process step) an interconnection wiring line 130a in core/peripheral region are formed by using the same conductive material as the bit line. By doing this, the conventional method can simplify the process and reduce the cost. Capping layers 132 and 134 for example silicon nitride layer($Si_3N_4$) are formed to coat exposed portion of the bit line 130 and the interconnection wiring line 130a so as to protect the bit line 130 and the interconnection wiring line 130a during subsequent etching process. After that, lower electrode 136(i.e., storage electrode) of the capacitor, dielectric film, and upper electrode 140 (i.e., plate electrode) are sequentially formed.

Herein, the step of forming the storage electrode 136 includes depositing a conductive material over the semiconductor substrate and etching the conductive material to form the storage electrode 136 using predetermined pattern. Because the conductive material in the core/peripheral region must be completely removed away, over etch can be conducted. Therefore, in the step of etching the conductive material, the capping layers 132 and 134 in the core/peripheral region can be etched and further in the steps of forming the dielectric film and the plate electrode 140 can be etched, thereby causing open fail of the interconnection wiring line 130a. But also, in the case of reducing the etching rate in the core/peripheral region so as to overcome above problems, material residues occurs between the bit lines 130 or the interconnection wiring lines 130a, thereby making it difficult to form contact hole.

SUMMARY OF THE INVENTION

The present invention provides an improved method for fabricating a semiconductor memory device. A key feature of the invention is forming an interconnection wiring line in core/peripheral region before bit line formation in cell array region.

Accordingly, an object of the present invention is to provide a method for fabricating a semiconductor memory device, being capable of preventing over etching of a capping layer which is formed on the interconnection wiring line.

It is a further object of the invention to provide a method for fabricating the semiconductor memory device, being capable of preventing open fail between the interconnection wiring line.

It is yet another object of the invention to provide a method for fabricating the interconnection wiring line, being capable of improving the process margin in the core/peripheral region.

Other aspect, objects, and the several advantages of the present invention will be apparent to one skilled in the art from a reading of the following disclosure and appended claims.

To achieve this and other advantages and in accordance with the purpose of the present invention, a transistor having source/drain and gate is formed over a semiconductor substrate in cell array and core/peripheral regions, respectively. A first interlayer insulating film is formed over the semiconductor substrate including the transistor. A conductive pad for a bit line and an interconnection wiring line are simultaneously formed by etching the first interlayer insulating film and electrically connected to the source/drain in the cell array region and to the transistor in the core/peripheral regions, respectively. A second interlayer insulating film is formed over the first interlayer insulating film including the conductive pad and the interconnection wiring. A contact plug for a storage electrode is formed by etching the second and first interlayer insulating films in the cell array region and electrically connected to the source/drain of the transistor in cell array region. A conductive layer for the bit line is formed by etching the second interlayer insulating film in the cell array region and electrically connected to the conductive pad. A capping layer is formed to coat exposed portion of the conductive layer. The storage electrode is formed over the second interlayer insulating film such that electrically connected to the contact plug.

To achieve this and other advantages and in accordance with the purpose of the present invention, a transistor having source/drain and gate is formed over a semiconductor substrate in cell array and core/peripheral regions, respectively. A first interlayer insulating film is formed over the semiconductor substrate including the transistor. A conductive pad for a bit line is formed by etching the first interlayer insulating film in the cell array region and electrically connected to the source/drain in the cell array region. A second interlayer insulating film is formed over the first interlayer insulating film including the conductive pad. An interconnection wiring line is formed by etching the second and first interlayer insulating films in the core/peripheral region and electrically connected to the transistor in the core/peripheral region. A third interlayer insulating film is formed over the second interlayer insulating film including the interconnection wiring. A contact plug for a storage electrode is formed by etching the third, second, and first interlayer insulating films in the cell array region and electrically connected to the source/drain of the transistor in cell array region. A conductive layer for the bit line is formed by etching the third and second interlayer insulating films in the cell array region and electrically connected to the conductive pad. A capping layer is formed to coat exposed portion of the conductive layer. The storage electrode is formed over the third interlayer insulating film such that electrically connected to the contact plug.

To achieve this and other advantages and in accordance with the purpose of the present invention, a transistor having source/drain and gate is formed over a semiconductor substrate in cell array and core/peripheral regions, respectively. A first interlayer insulating film is formed over the semiconductor substrate including the transistor. An interconnection wiring line is formed by etching the first interlayer insulating film in the core/peripheral region and electrically connected to the transistor in the core/peripheral region. A second interlayer insulating film is formed over the first interlayer insulating film including the interconnection wiring. A contact plug for a storage electrode is formed by etching the second and first interlayer insulating films in the cell array region and electrically connected to the source/drain of the transistor in cell array region. A conductive layer for the bit line is formed by etching the second and first interlayer insulating films and electrically connected to the source/drain in the cell array region. A capping layer is formed to coat exposed portion of the conductive layer. The storage electrode is formed over second interlayer insulating film such that electrically connected to the contact plug.

BRIEF DESCRIPTION OF THE DRAWINGS

The invention may be understood and its objects will become apparent to those skilled in the art by reference to the accompanying drawings as follows.

DETAILED DESCRIPTION OF THE PREFERRED EMBODIMENTS

The preferred embodiment of the present invention will now be described with reference to the accompanying drawings.

(Embodiment 1)

FIG. 2a to FIG. 2d are flow diagrams showing a novel method for forming a semiconductor memory device according to preferred embodiment 1.

Figure 1:
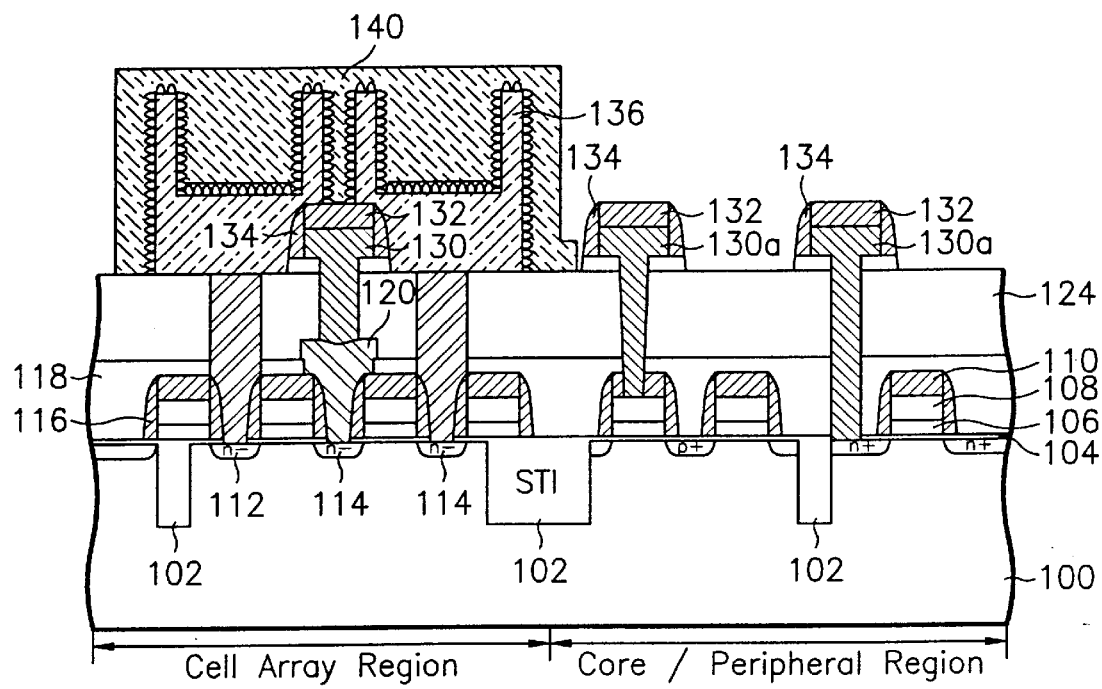
FIG. 1 is a cross-sectional view showing a conventional DRAM structure.
Figure 2A:
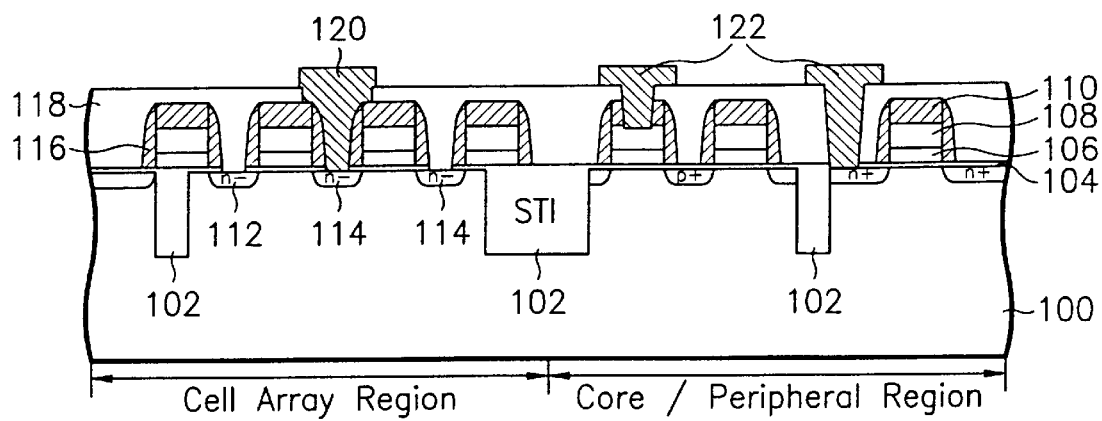
FIG. 2a to FIG. 2d are flow diagrams showing a novel method for forming a semiconductor memory device according to preferred embodiment 1.

Referring to FIG. 2a, a device isolation region 102 that defines a cell array region and a core/peripheral region is formed over a semiconductor substrate 100. Herein, the device isolation region 102 is formed by shallow trench isolation(STI) technique. A gate oxide layer 104, a first conductive layer 106, a second conductive layer 108, and a first insulating layer 110 are laminated over the semiconductor substrate 100 and pattern to form a gate pattern. Herein, the first conductive layer 106 may be an impurity doped polysilicon and the second conductive layer 108 may be a metal silicide, thereby forming polycide structure or the first and second conductive layers 106 and 108 may be a metal, thereby forming a metal structure. The first insulating layer 110, i.e., gate capping layer, may be a silicon oxide layer or a silicon nitride layer.

Impurity ions are implanted into the semiconductor substrate 100 using the gate as an implanting mask thereby to form a source and drain regions 112 and 114. And then, about 500 Å-thick second insulating layer is deposited over the resulting structure and anisotropic etching is performed to form a gate spacer 116 on both side walls of the gate pattern. The second insulating layer may be silicon nitride layer.

A third insulating layer is deposited over the resulting structure to have a thickness of about 5000 Å or less and planarized to form a first interlayer insulating film 118. The planarization process may be conformal BPSG technique, $O_3$-TEOS reflow technique, or combination of etch-back and $O_3$-TEOS reflow.

An isotropic etching is performed to form contact holes in the cell array region and the core/peripheral region. The contact holes are filled with a third conductive layer, thereby to form simultaneously a conductive pad 120 for a bit line which is electrically connected to the drain region 114 in the cell array region and an interconnection wiring line 122. Herein, the third conductive layer may be impurity doped polysilicon layer.

Figure 2B:
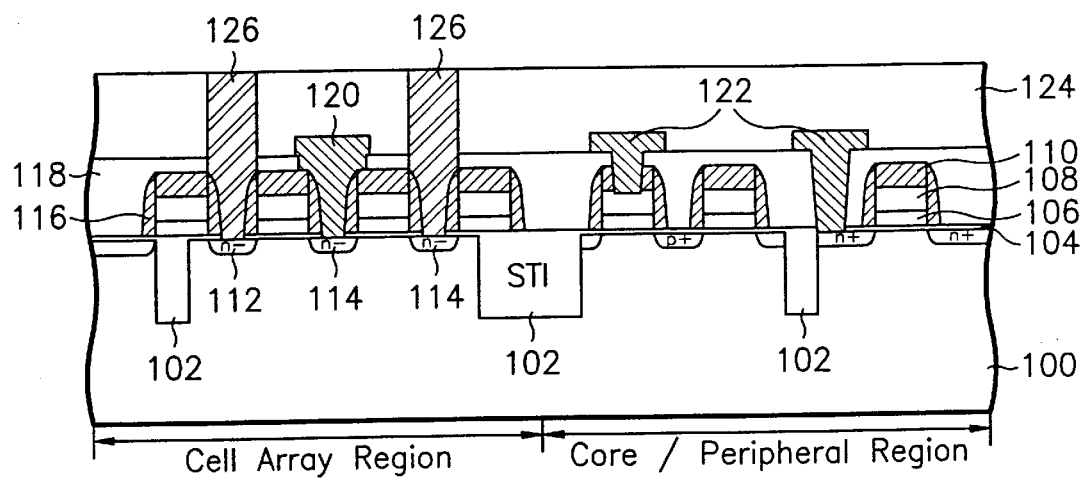

Referring to FIG. 2b, a fourth insulating layer is deposited over the resulting structure and planarized to form a second interlayer insulating film 124. The planarization process may be etch-back using the $O_3$-TEOS or CMP(chemical mechanical polishing). In the first embodiment, the interconnection wiring line 122 is not affected by the planarization process for the second interlayer insulating film 124 because the second interlayer insulating film 124 is formed thereover.

An isotropic etching process is conducted on the second and first interlayer insulating films 124 and 118 by using predetermined pattern, thereby to form a buried contact hole for storage electrode contact which expose the source region 112 in the cell array region. After that, the buried contact hole for storage electrode contact is filled with a fourth conductive layer thereby to form a contact plug 126 which is electrically connected to the source region 112 in the cell array region.

Figure 2C:
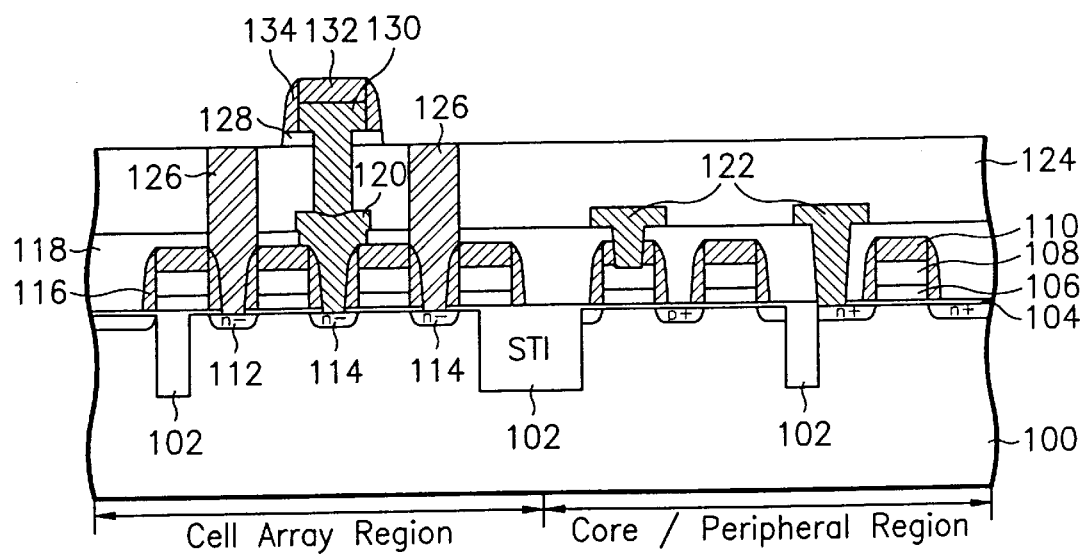
Figure 2D:
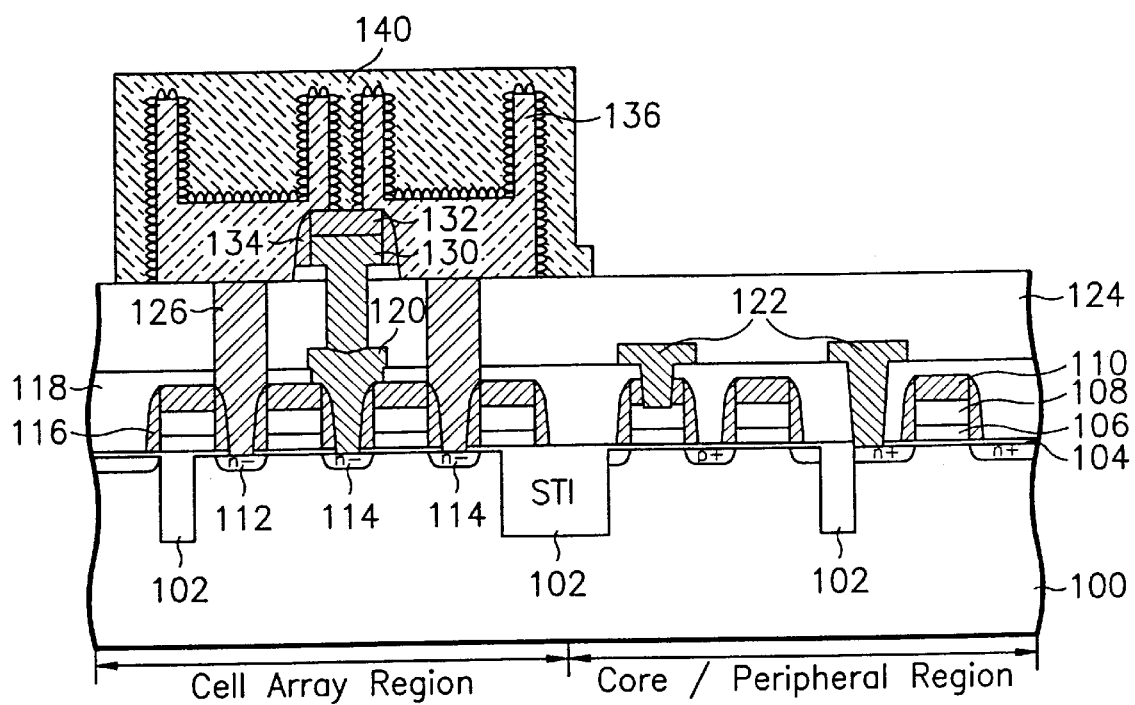

Referring to FIG. 2c, a fifth insulating layer 128 is deposited over the second interlayer insulating film 124 to have a thickness of about 500 to 1000 Å. The fifth insulating layer 128 preferably is formed by CVD(chemical vapor deposition) method at temperature about 300 to 400° C. so as to minimize oxidation of underlying the contact plug 126.

The fifth insulating layer 128 and the second interlayer insulating film124 are anisotropic etched to formed a contact hole exposing the conductive pad 120. After that, a conductive layer for bit line is deposited over the fifth insulating layer 128 including the contact hole. About 1000 to 3000Å thick-sixth insulating layer 132 is deposited over the resulting structure and patterned to form a bit line pattern by conventional photolithography. The bit line pattern comprises a bit line 130 and a capping layer pattern 132 which is stacked on the bit line 130. Herein, we must pay attention to the fact that in the core/peripheral region, the interconnection wiring line is not formed.

Still referring to FIG. 2c, a seventh insulating layer is deposited over the resulting structure and anisotropic etching is performed thereby to form a spacer 134 on both side of the bit line pattern 130 until the second interlayer insulating film 124 and the contact plug 126 are exposed. The conductive layer for the bit line 130 may be tungsten or silicide. Further, several hundred Å thick-barrier layer such as Ti, TiN, or Ti/TiN layer may be formed.

Referring to 2d, a storage electrode 136 are formed thereby electrically connected to the contact plug 126. After that, through the conventional fabrication method, a dielectric film, a plate electrode, and metallization are realized.

(Embodiment 2)

FIG. 3a to FIG. 3d are flow diagrams showing a novel method for forming a semiconductor memory device according to preferred embodiment 2. In FIG. 3a to FIG. 3d, the same part functioning as shown in FIG. 2a to FIG. 2d is identified with the same reference number and explanation of the same process step will be omitted.

Figure 3A:
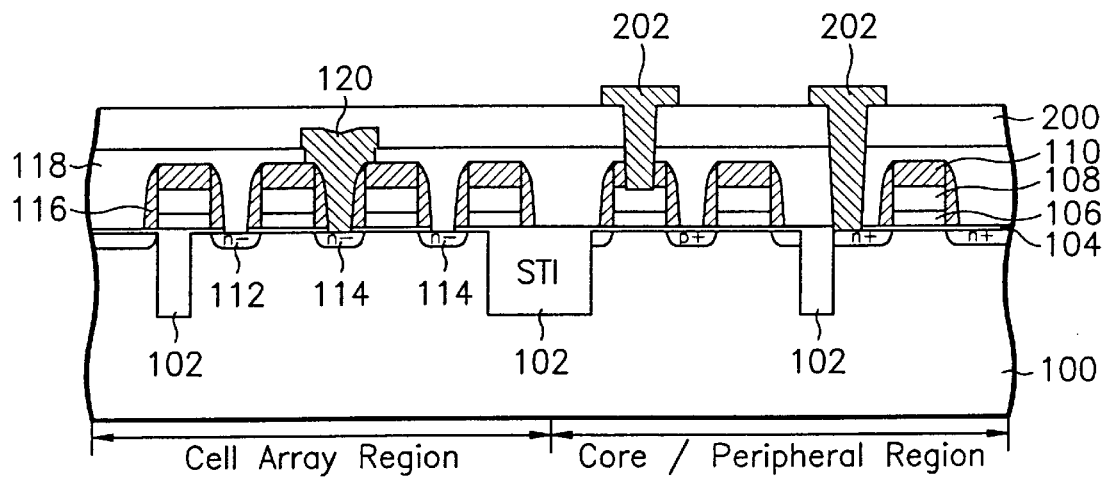
FIG. 3a to FIG. 3d are flow diagrams showing a novel method for forming a semiconductor memory device according to preferred embodiment 2.

Referring to FIG. 3a, after the conductive pad 120 is formed, a planar insulating layer 200 is formed over the first interlayer insulating film 118 including the conductive pad 120. After that, photolithography is conducted on the core/peripheral region thereby to form a contact hole for interconnection wiring line. A conductive material is deposited over the planar insulating layer 200 including the contact hole for the interconnection wiring line and patterned to form the interconnection wiring line 202. The conductive material may be tungsten. Or barrier layer such as Ti, TiN, or Ti/TiN may be further formed.

Figure 3B:
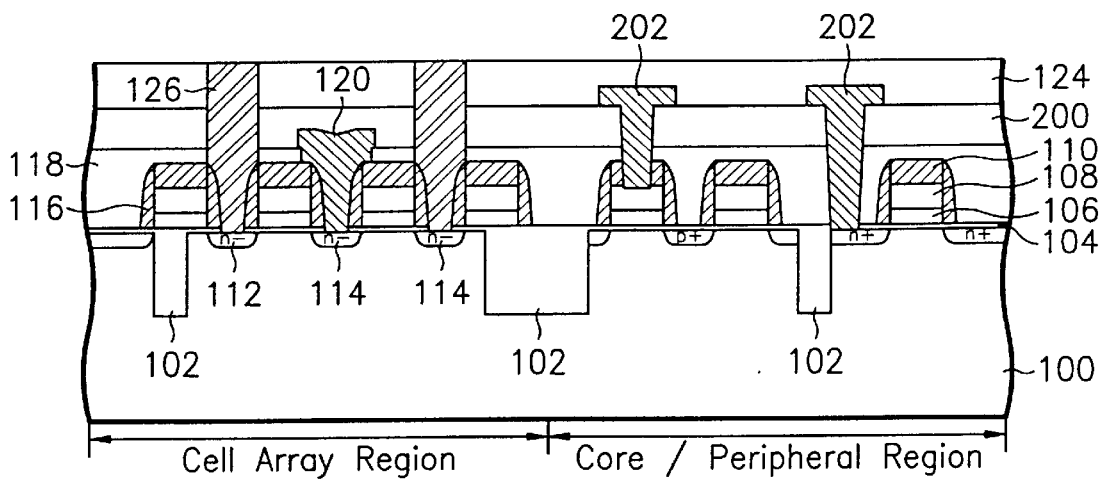
Figure 3C:
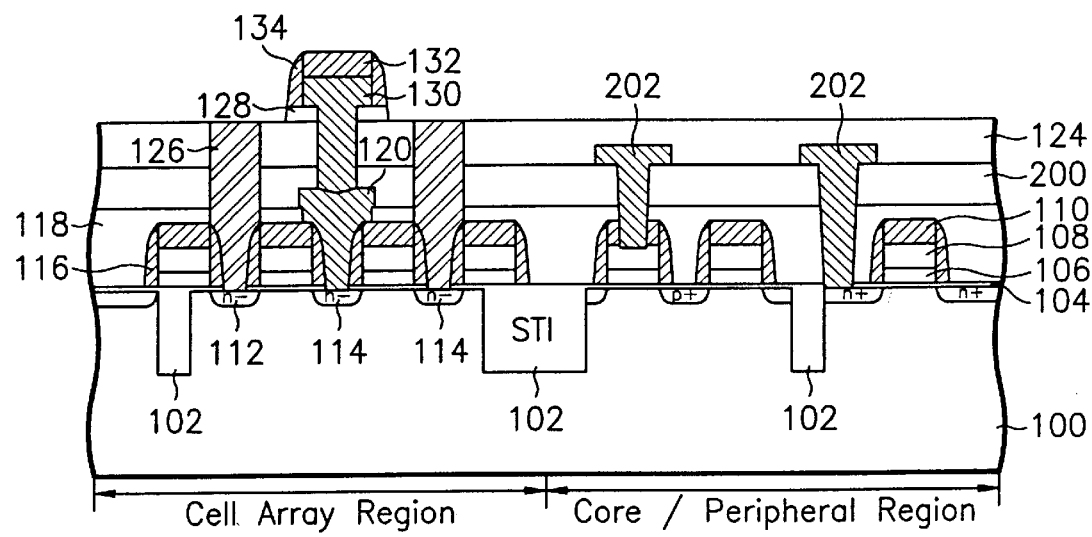
Figure 3D:
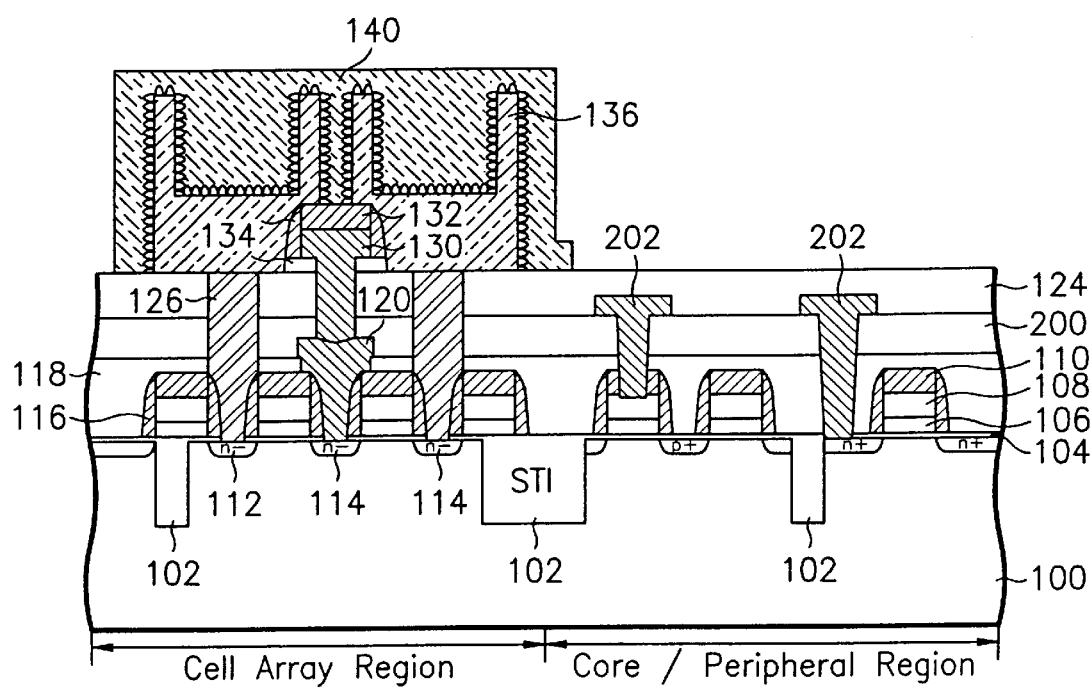

The successive steps illustrated in FIG. 3b to FIG. 3d are the same as the first embodiment and the explanation thereof will be omitted.

The modification and the combination of the first and second embodiments may be made without the spirit and scope of these embodiment by those skilled in the art.

Figure 4:
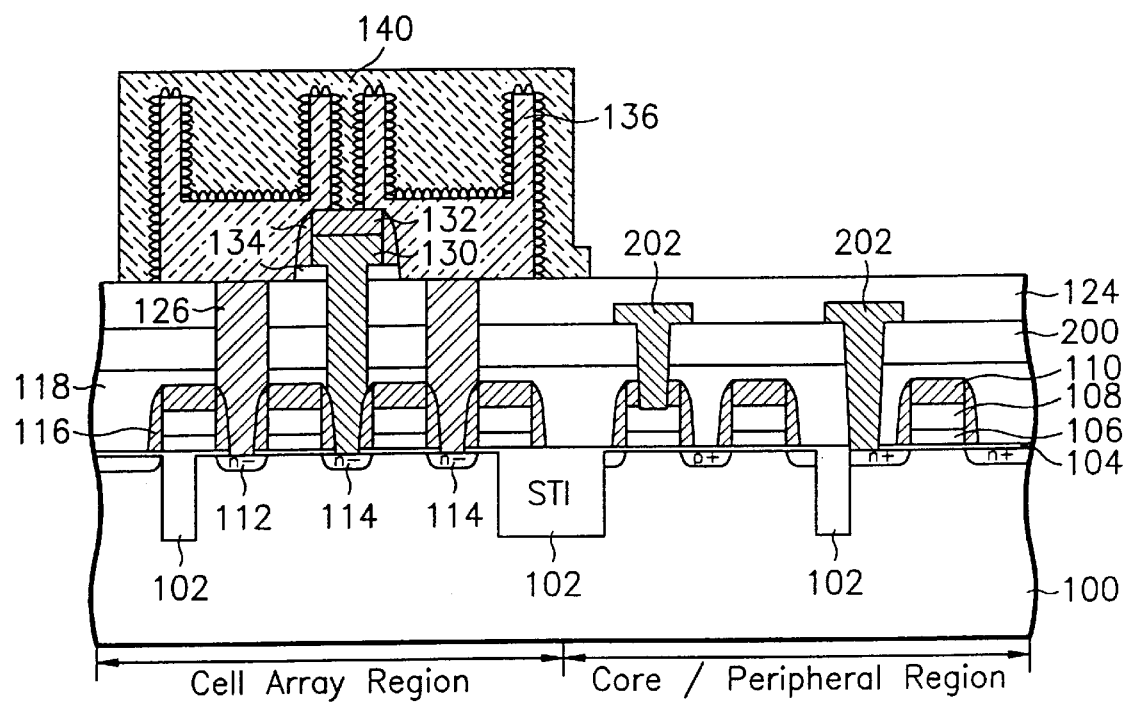
FIG. 4 is a cross-sectional view showing modified embodiment of the present invention.

The first and second embodiments may be applied to the DRAM device without the conductive pad 120. FIG. 4 is a cross-sectional view showing modified embodiment of the present invention. As shown in FIG. 4, the conductive pad 120 of the first and second embodiments is not formed. The fabrication process of the modified embodiment of the present invention is the same as the first and second embodiments except the step of forming the conductive pad.

Figure 5:
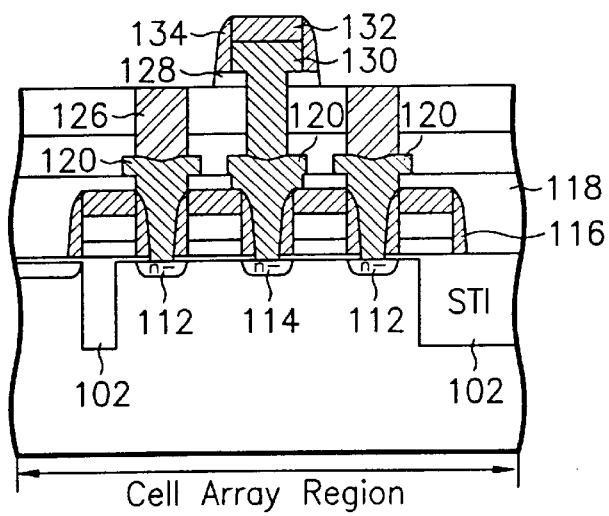
FIG. 5 is a cross-sectional view showing another modified embodiment of the present invention.

FIG. 5 is a cross-sectional view showing another modified embodiment of the present invention. As shown in FIG. 5, in the first and second embodiments, conductive pad for the storage electrode may be formed in the same step of forming the conductive pad 120 for the bit line.

As understood from the explanation, in accordance with the present invention, the interconnection wiring line in the core/peripheral region is formed before the step of forming the bit line in the cell array region, thereby avoiding open fail of the interconnection wiring line and improving process margin in the core/peripheral region.

While this invention has been particularly shown and described with reference to the preferred embodiments thereof, it will be understood by those skilled in the art that various changes in form and details may be made without departing from the spirit and scope of this invention.

What is claimed is:

1. A method of forming an integrated circuit memory device, comprising the steps of:

forming first and second pluralities of insulated-gate field effect transistors on a cell array portion and a peripheral circuit portion of a semiconductor substrate, respectively;

forming a first interlayer insulating layer on the first and second pluralities of insulated-gate field effect transistors; then forming a first interconnection wiring line that extends through the first interlayer insulating layer and electrically contacts a source/drain of an insulated-gate field effect transistor within the second plurality of insulated-gate field effect transistors; then forming an upper interlayer insulating layer on the first interlayer insulating layer and on the first interconnection wiring line; then forming a bit line that extends on the upper interlayer insulating layer and through the upper and first interlayer insulating layers and is electrically coupled to a first source/drain region of a first insulated-gate field effect transistor within the first plurality of insulated-gate field effect transistors; and forming a storage electrode of a capacitor that extends on the upper interlayer insulating layer and through the upper and first interlayer insulating layers and is electrically coupled to a second source/drain region of the first insulated-gate field effect transistor.

2. The method of claim 1, wherein said step of forming an upper interlayer insulating layer is preceded by the step of forming a conductive pad that extends through the first interlayer insulating layer and electrically contacts the first source/drain region of the first insulated-gate field effect transistor.

3. The method of claim 2, wherein said step of forming a bit line is preceded by the step of selectively etching the upper interlayer insulating layer to define a bit line contact hole therein that exposes the conductive pad.

4. The method of claim 3, wherein the first interconnection wiring line and the conductive pad comprise the same material.

5. The method of claim 2, wherein said step of forming a first interconnection wiring line is preceded by the step of forming a second interlayer insulating layer on the conductive pad and on the first interlayer insulating layer.

6. The method of claim 5, wherein said step of forming a first interconnection wiring line is preceded by the step of forming a contact hole that extends through the first and second interlayer insulating layers and exposes the source/drain of an insulated-gate field effect transistor within the second plurality of insulated-gate field effect transistors.

7. The method of claim 1, wherein said step of forming a bit line is preceded by the steps of:

selectively etching the upper interlayer insulating layer and the first interlayer insulating layer to define a contact hole therein that exposes the second source/drain region of the first insulated-gate field effect transistor; and forming a bit line contact plug in the contact hole.

8. The method of claim 1, wherein said step of forming an upper interlayer insulating layer is preceded by the step of forming a first conductive pad that extends through the first interlayer insulating layer and electrically contacts the first source/drain region of the first insulated-gate field effect transistor and forming a second conductive pad that extends through the first interlayer insulating layer and electrically contacts the second source/drain region of the first insulated-gate field effect transistor.

9. The method of claim 8, wherein said step of forming a bit line is preceded by the steps of:

selectively etching the upper interlayer insulating layer to define a storage electrode contact hole therein that exposes the second conductive pad; and then selectively etching the upper interlayer insulating layer to define a bit line contact hole therein that exposes the first conductive pad.

10. The method of claim 8, wherein the first conductive pad is formed at the same level as the first interconnection wiring line.

11. The method of claim 8, wherein the first conductive pad is formed at the same level as the second conductive pad.

* * * * *